US009683308B2

(12) United States Patent
Olsen et al.

(10) Patent No.: US 9,683,308 B2
(45) Date of Patent: Jun. 20, 2017

(54) METHOD AND APPARATUS FOR PRECLEANING A SUBSTRATE SURFACE PRIOR TO EPITAXIAL GROWTH

(71) Applicant: Applied Materials, Inc., Santa Clara, CA (US)

(72) Inventors: Christopher S. Olsen, Fremont, CA (US); Theresa K. Guarini, San Jose, CA (US); Jeffrey Tobin, Mountain View, CA (US); Lara Hawrylchak, Gilroy, CA (US); Peter Stone, Los Gatos, CA (US); Chi Wei Lo, San Jose, CA (US); Saurabh Chopra, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 105 days.

(21) Appl. No.: 14/338,245

(22) Filed: Jul. 22, 2014

(65) Prior Publication Data
US 2015/0040822 A1 Feb. 12, 2015

Related U.S. Application Data

(60) Provisional application No. 61/864,444, filed on Aug. 9, 2013.

(51) Int. Cl.
| C30B 25/18 | (2006.01) |
| C30B 29/06 | (2006.01) |
| C30B 29/08 | (2006.01) |

(52) U.S. Cl.
CPC ............ *C30B 25/186* (2013.01); *C30B 29/06* (2013.01); *C30B 29/08* (2013.01)

(58) Field of Classification Search
CPC combination set(s) only.
See application file for complete search history.

(56) References Cited

U.S. PATENT DOCUMENTS

| 6,872,323 | B1 | 3/2005 | Entley et al. |
| 7,150,796 | B2 | 12/2006 | Smith et al. |
| 7,655,571 | B2 | 2/2010 | Kawaguchi et al. |
| 8,008,166 | B2 | 8/2011 | Sanchez et al. |
| 8,058,181 | B1 | 11/2011 | Chen et al. |
| 2004/0028835 | A1 | 2/2004 | Lin |
| 2004/0121609 | A1 | 6/2004 | Lee et al. |
| 2008/0268645 | A1 | 10/2008 | Kao et al. |
| 2009/0029528 | A1* | 1/2009 | Sanchez et al. .............. 438/476 |
| 2010/0083981 | A1 | 4/2010 | Ueda et al. |
| 2010/0173127 | A1 | 7/2010 | Lieten et al. |
| 2012/0034761 | A1 | 2/2012 | Kuppurao et al. |

OTHER PUBLICATIONS

PCT Notification of Transmittal of the International Search Report and the Written Opinion of the International Searching Authority for International Application No. PCT/US2014/047688 dated Nov. 5, 2014; 10 total pages.

* cited by examiner

*Primary Examiner* — Duy Deo
*Assistant Examiner* — Erin Bergner
(74) *Attorney, Agent, or Firm* — Patterson + Sheridan, LLP (57) ABSTRACT

Embodiments of the present invention generally relate to methods for removing contaminants and native oxides from substrate surfaces. The methods generally include removing contaminants disposed on the substrate surface using a plasma process, and then cleaning the substrate surface by use of a remote plasma assisted dry etch process.

7 Claims, 7 Drawing Sheets

METHOD AND APPARATUS FOR PRECLEANING A SUBSTRATE SURFACE PRIOR TO EPITAXIAL GROWTH

CROSS-REFERENCE TO RELATED APPLICATIONS

This application claims priority to U.S. Provisional Patent Application Ser. No. 61/864,444, filed on Aug. 9, 2013, which herein is incorporated by reference.

BACKGROUND

Field

Embodiments of the present invention generally relate to methods and apparatuses for removing contaminants and oxides from a substrate surface.

Description of the Related Art

Integrated circuits are formed in and on silicon and other semiconductor substrates. In the case of single crystal silicon, substrates are made by growing an ingot from a bath of molten silicon, and then sawing the solidified ingot into multiple wafers. An epitaxial silicon layer may then be formed on the monocrystalline silicon wafer to form a defect free silicon layer that may be doped or undoped. Semiconductor devices, such as transistors, are manufactured from the epitaxial silicon layer. The electrical properties of the formed epitaxial silicon layer will generally be better than the properties of the monocrystalline silicon substrate.

Surfaces of the monocrystalline silicon and the epitaxial silicon layer are susceptible to contamination when exposed to typical wafer fabrication facility ambient conditions. For example, a native oxide layer may form on the monocrystalline silicon surface prior to deposition of the epitaxial layer. Additionally, contaminants present in the ambient environment may deposit on the monocrystalline surface. The presence of a native oxide layer or contaminants on the monocrystalline silicon surface negatively affects the quality of an epitaxial layer subsequently formed on the monocrystalline surface. While present cleaning methods remove some of the native oxides and contaminants from the monocrystalline silicon surface, some contaminants still remain.

Therefore, there is a need for a method and apparatus for cleaning a substrate surface, especially for cleaning a substrate surface prior to performing an epitaxial deposition process.

SUMMARY

Embodiments of the present invention generally relate to methods for removing contaminants and native oxides from substrate surfaces. The methods generally include removing contaminants disposed on the substrate surface using a plasma process, and then cleaning the substrate surface by use of a remote plasma assisted dry etch process.

In one embodiment, a method for cleaning a surface of a substrate is disclosed. The method includes removing contaminants from the surface of the substrate, wherein the contaminants are removed by a reducing process, then cleaning the surface of the substrate by use of a plasma etch process, wherein at least one process gas is used during the plasma etch process, and forming an epitaxial layer on the surface of the substrate.

In another embodiment, a method for forming an epitaxial layer on a surface of a substrate is disclosed. The method includes removing contaminants from the surface of the substrate, wherein the contaminants are removed by a reducing process, then cleaning the surface of the substrate by use of a plasma etch process, and then forming an epitaxial layer on the surface of the substrate.

In another embodiment, a method for cleaning a surface of a substrate is disclosed. The method includes removing contaminants from the surface of the substrate, wherein the contaminants are removed by a reducing process, cleaning the surface of the substrate by use of a plasma etch process, wherein at least one of process gases used during the plasma etch process comprises fluorine, and forming an epitaxial layer on the surface of the substrate.

In another embodiment, an apparatus for forming an epitaxial layer on a surface of a substrate is disclosed. The apparatus includes a first processing chamber coupled to a first transfer chamber, wherein the first processing chamber is configured to perform a reducing process to remove contaminants from the surface of the substrate, a cleaning chamber coupled to the first transfer chamber, wherein the cleaning chamber is configured to perform a plasma etch process to remove an oxide layer, a second transfer chamber coupled to the first transfer chamber by a second processing chamber, and a plurality of third processing chambers coupled to the second transfer chamber, wherein the plurality of third processing chambers are configured to deposit an epitaxial layer on the surface of the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally relate to methods for removing contaminants and native oxides from substrate surfaces. The methods generally include removing contaminants disposed on the substrate surface using a plasma process, and then cleaning the substrate surface by use of a remote plasma assisted dry etch process.

Figure 1:
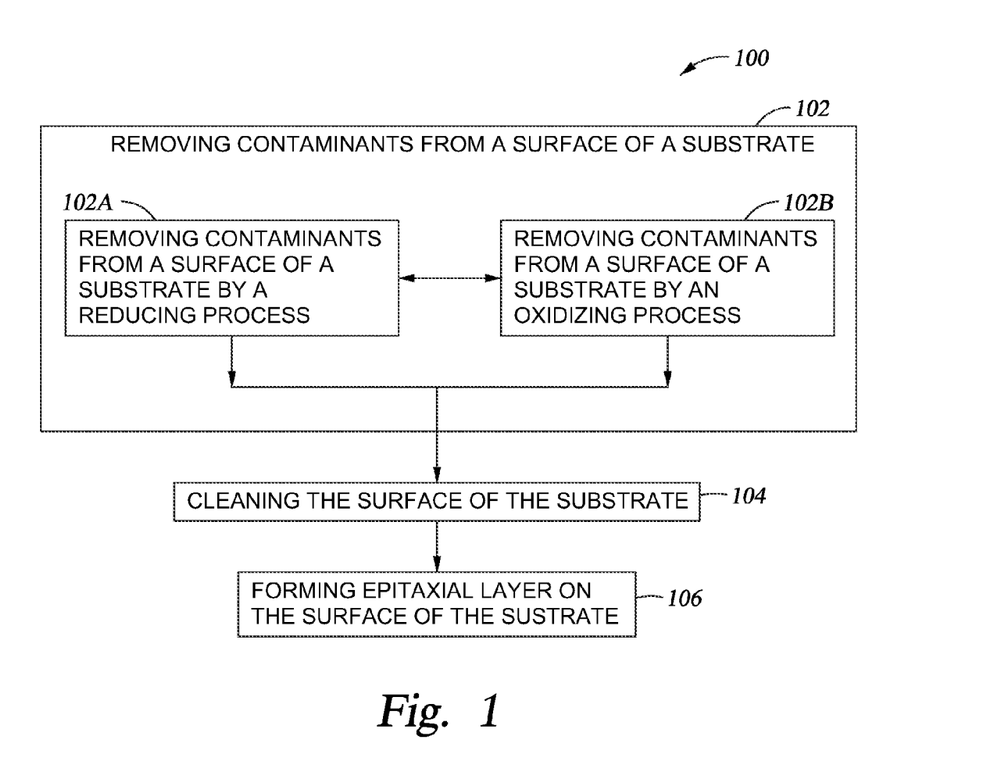
FIG. 1 illustrates a processing sequence in accordance with one embodiment of the present invention.

FIG. 1 illustrates a processing sequence 100 in accordance with one embodiment of the present invention. The process sequence 100 begins at step 102. In step 102, contaminants on a surface of a substrate are removed. The substrate may include a silicon containing material and the surface may include a material, such as silicon (Si), germanium (Ge) or silicon germanium alloys (SiGe). In some embodiments, the Si, Ge, or SiGe surface may have contaminants and an oxide layer, such as native oxide layer, disposed thereon. Due to the sensitivity of epitaxial deposition processes to contaminants, such as carbon containing contaminants, exposure to most typical cleanroom environments for a few hours will allow a significant amount of contaminants to reaccumulate on the surface of the substrate such that the accumulated contaminants will affect the quality of the subsequently formed epitaxial layer.

Figure 2:
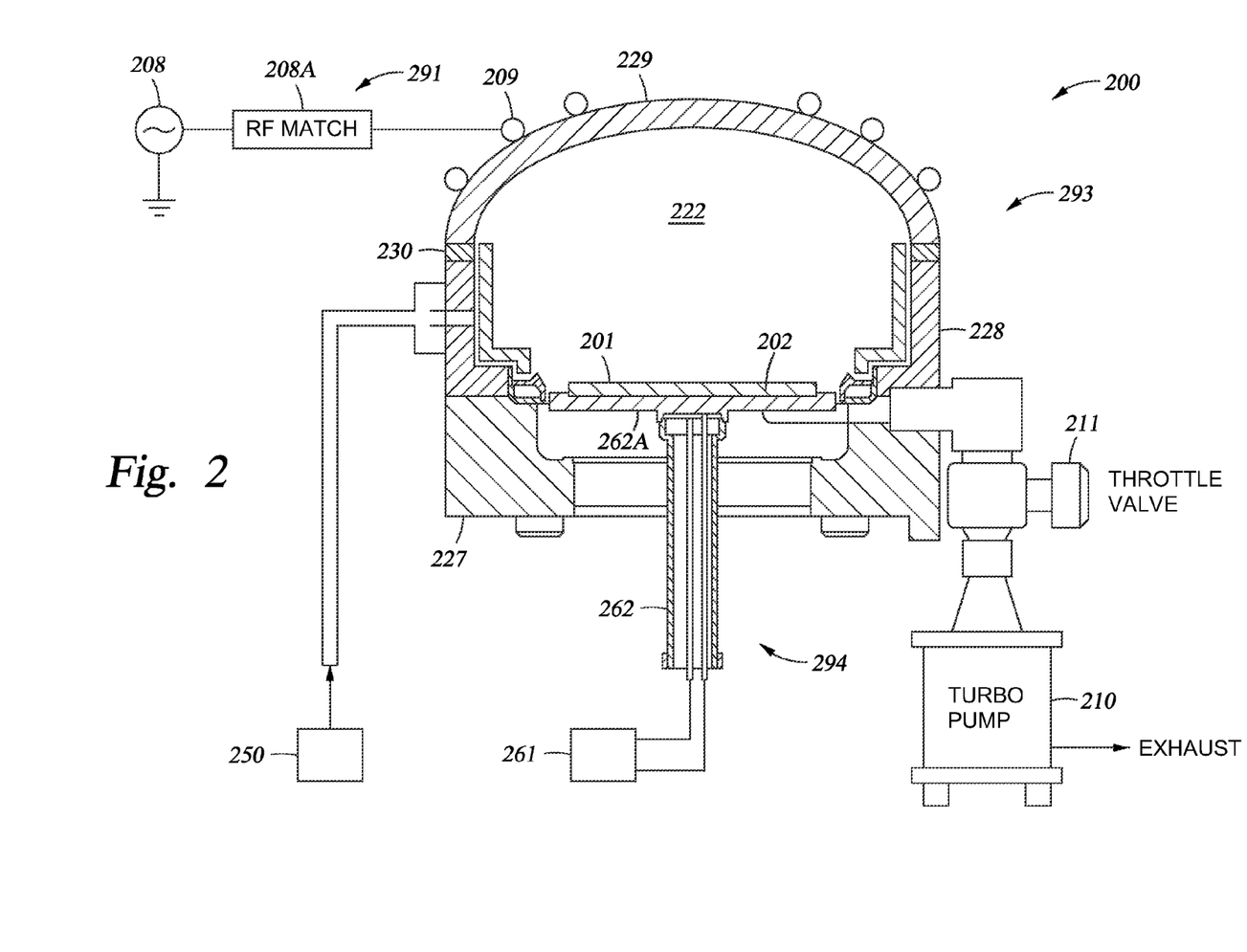
FIG. 2 is a cross sectional view of a processing chamber according to one embodiment of the invention.
Figure 3:
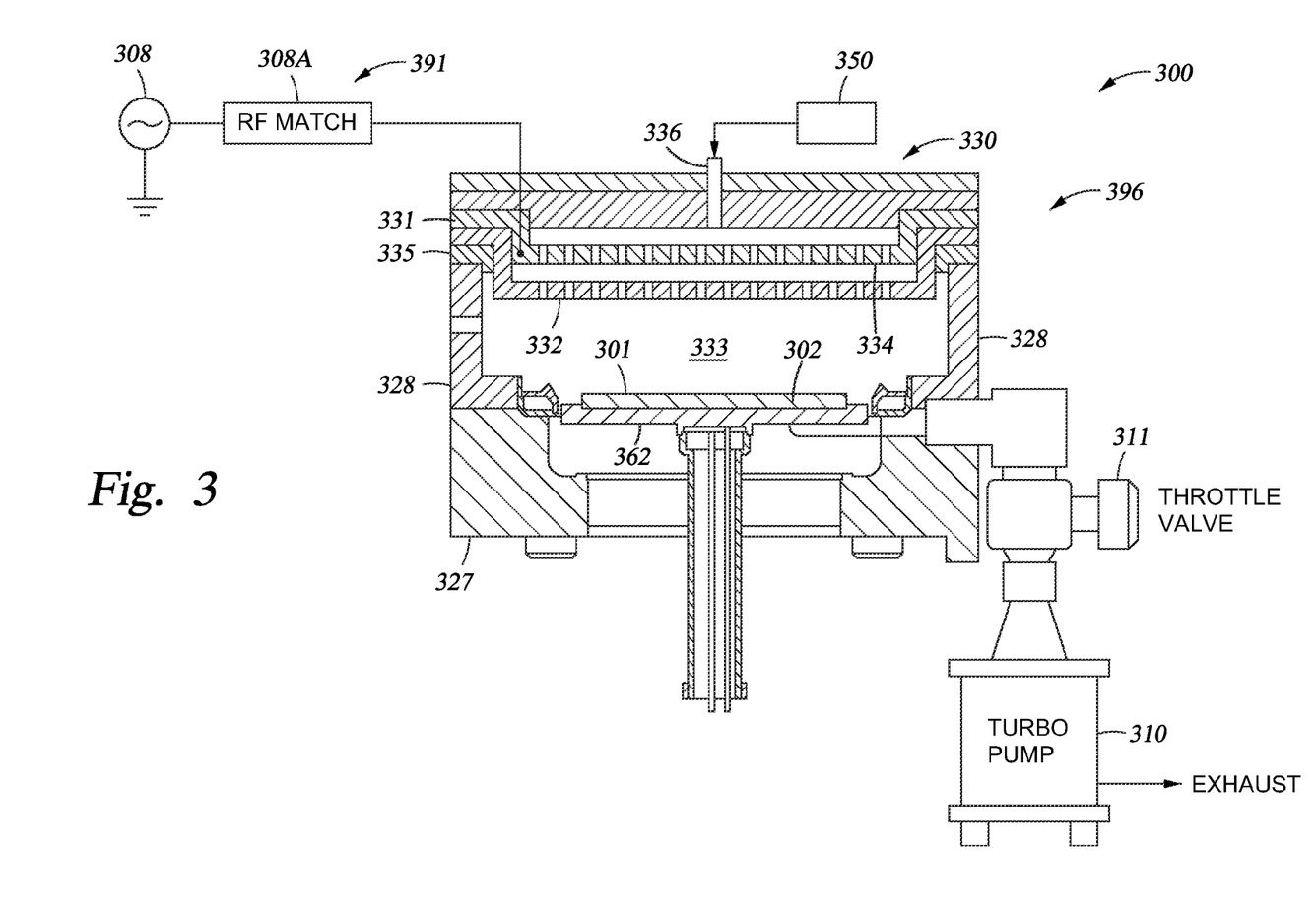
FIG. 3 is a cross sectional view of another processing chamber according to one embodiment of the invention.
Figure 4:
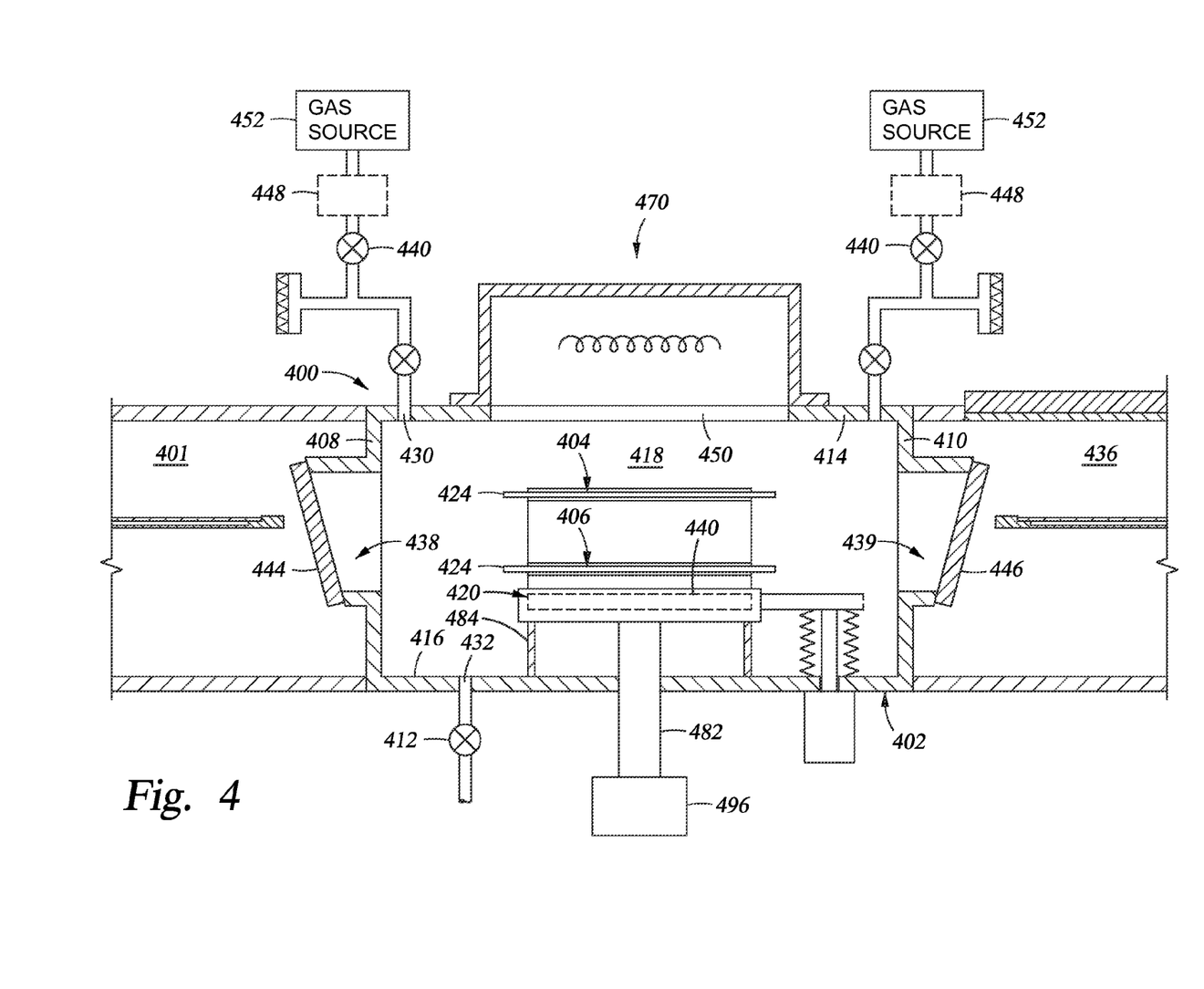
FIG. 4 is a cross sectional view of another processing chamber according to one embodiment of the invention.

In some embodiments of step 102, contaminants may be removed from a surface of the substrate using a reducing process 102A and/or an oxidizing process 102B. There are several reducing processes that may be suitable for contaminant removal, which are described herein. In one embodiment, contaminants are removed using a hydrogen containing plasma. The plasma may contain hydrogen gas ($H_2$) and/or argon (Ar) and ammonia ($NH_3$) gases. The plasma may be inductively or capacitively coupled, or the plasma may be energized by a microwave source. In one embodiment, the plasma is inductively coupled, the processing temperature may be about 400 degrees Celsius (° C.) and the processing pressure may be about 20 milliTorr (mTorr). A processing chamber that can be adapted to perform a reducing process using an inductively coupled plasma is illustrated in FIG. 2. FIG. 3 illustrates a processing chamber that can be adapted to perform a reducing process using a capacitively coupled plasma. FIG. 4 illustrates a processing chamber that can be adapted to perform a different reducing process using an inductively coupled plasma.

Figure 5:
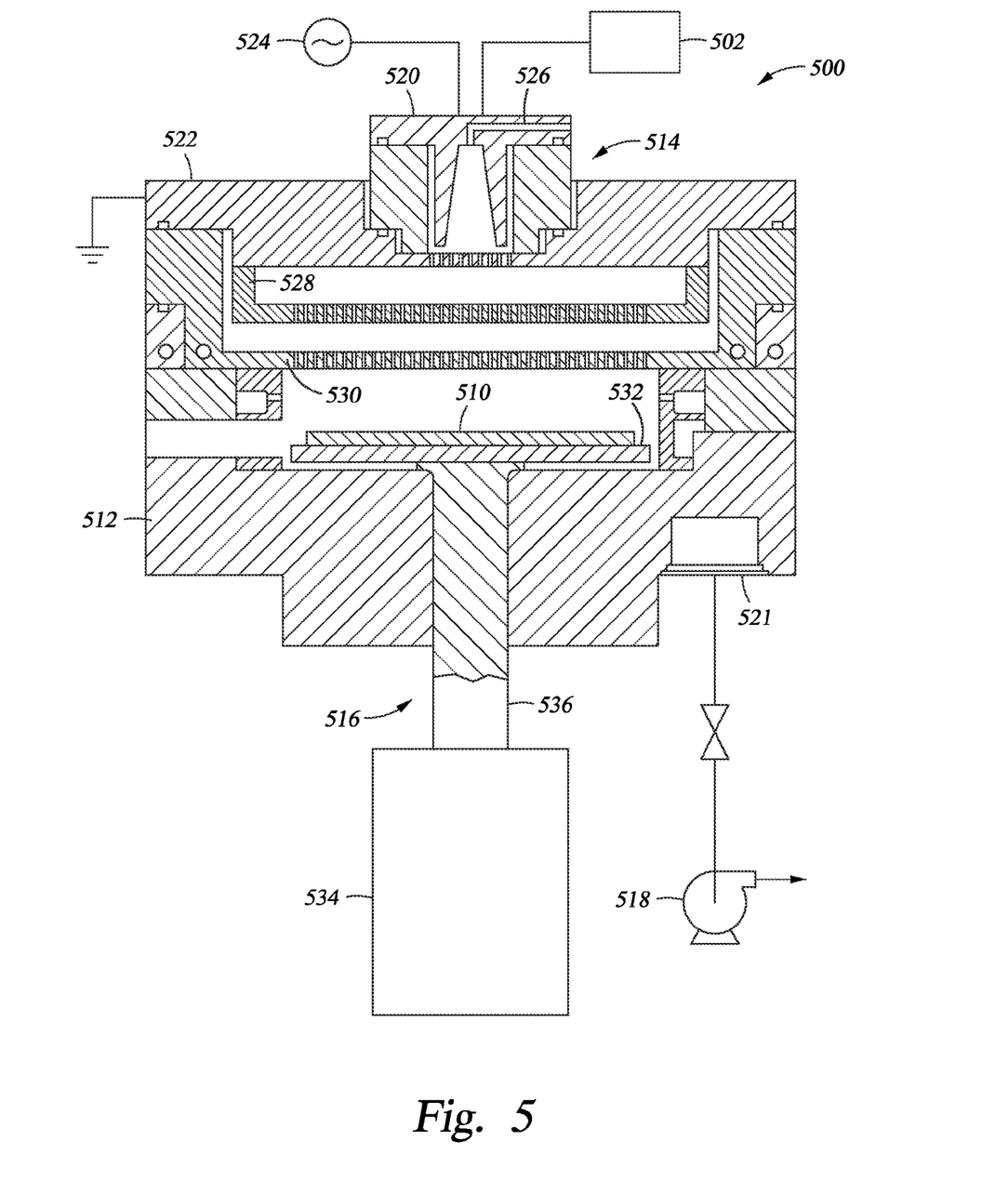
FIG. 5 is a cross sectional view of a cleaning chamber according to one embodiment of the invention.

After removing the contaminants, as shown in step 104, the surface of the substrate is cleaned using a cleaning process. The cleaning process may include a plasma etching process, which is discussed more below. In some embodiments, the plasma etching process may use a fluorine containing plasma. A processing chamber that can be adapted to perform the plasma etch process is illustrated in FIG. 5.

Next, in step 106, an epitaxial layer is deposited on the surface of the substrate. Steps 102, 104 and 106 may be performed in one processing system, such as a cluster tool illustrated in FIG. 6. Alternatively, step 102 may be performed in a processing chamber that is not within a processing system that contains processing chambers in which steps 104 and 106 are performed, as illustrated in FIG. 7.

FIG. 2 is a cross sectional view of a processing chamber 200 according to one embodiment. The processing chamber 200 is an inductively coupled plasma processing chamber that is adapted to perform at least some of the processes found in step 102A, and thus removes contaminants, such as carbon or hydrocarbons accumulated on a surface 201 of a substrate 202. In one embodiment, the processing chamber 200 is a modified Decoupled Plasma Nitridation (DPN) Chamber that is available from Applied Materials Inc. of Santa Clara, Calif.

The processing chamber 200 generally comprises a radio frequency (RF) source assembly 291, a process chamber assembly 293, and a substrate support assembly 294. The process chamber assembly 294 generally comprises multiple components that are used to form a vacuum in a processing region 222 so that a plasma process can be performed therein. In general the process chamber assembly 293 comprises a chamber base 227, chamber walls 228 and a chamber lid 229 that sealably enclose the processing region 222. The processing region 222 can be evacuated to a desired vacuum pressure by the use of a vacuum pump 210 that is connected to the processing region 222 through the chamber base 227 and/or chamber walls 228. Generally, the chamber walls 228 and chamber base 227 may be formed from a metal, such as aluminum, or other suitable material.

In one embodiment, the chamber walls 228 and chamber lid 229 may be temperature controlled. Conventional methods and/or heat exchanging devices may be used to heat and cool various chamber components. For example, the chamber walls 228 and chamber lid 229 may be heated by heaters (not shown), such as lamp arrays, positioned outside the process chamber assembly 293. In another example, cooling gases may be circulated outside the process chamber assembly 293 to cool the chamber walls 228 and chamber lid 229. In another example, heating and/or cooling conduits, which may be embedded in the chamber walls 228 and chamber lid 229, may be connected to a fluid heater/chiller device to control the temperature.

In one embodiment, the RF source assembly 291 is an inductive type RF source that generally contains an RF generator 208 and an RF match circuit 208A that are connected to a coil 209. The coil 209 is positioned adjacent to the chamber lid 229. In one embodiment, the RF generator 208 may operate at between about 0 and about 3000 W at a frequency between about 400 kHz and about 60 MHz. In one example, the RF generator 208 operates at a frequency of 13.56 MHz. In one embodiment, the RF generator 208 may provide pulses of RF energy to the coil 209 to generate a plasma that has a reduced energy level and/or plasma density. Use of a reduced energy hydrogen containing plasma may help to prevent roughening of the surface 201 of the substrate 202 during this processing step. Roughening of the surface 201 may negatively affect device properties and may cause gate leakage or poor subthreshold voltage. In some cases where an oxide layer, such as a native oxide layer, has been formed on the surface 201 of the substrate 202, the formed oxide layer may be advantageously used to help prevent the roughening of the surface during step 102A. The low energy level hydrogen containing plasma may be generated with a low RF power, such as between 10 W and 500 W, at a frequency between about 400 kHz and about 60 MHz, such as a frequency of about 13.56 MHz. Source RF powers can be operated in continuous wave mode, always on, or can be operated in pulsed mode, where the source power is on and off at a frequency of 100 Hz to 100 kHz.

The chamber lid 229 is generally a dielectric component (e.g., quartz, ceramic material (e.g., alumina)) that is adapted to allow the RF energy delivered from the inductive RF source assembly 291 to form a plasma in the processing region 222. The plasma may be formed outside of the processing region 222 and then introduced into the processing region 222. Processing gases exposed to remote plasma typically have a reduced energy level compare to processing gases that are exposed to an in-situ generated plasma at the same RF power level. Therefore, in some configurations, plasmas generated by a remote plasma source can be used to prevent roughening of the surface 201 of the substrate 202.

In one embodiment, the process chamber assembly 293 also contains a gas delivery system 250 that is adapted to deliver one or more process gasses into the processing region 222. In one embodiment, the processing region 222 is circumscribed with one or more shields 230 that are intended to protect the chamber walls 228 and/or the chamber lid 229 from the generated plasma and preparation processes performed in the chamber. In one embodiment, the gas delivery system is adapted to deliver a reactive gas, such as a hydrogen containing gas (e.g., $H_2$ or $NH_3$), and/or a fluorine containing gas, such as fluorine gas ($F_2$), nitrogen trifluoride ($NF_3$) or anhydrous HF, to name just a few. In one embodiment, the gas delivery system 250 is adapted to deliver an inert gas, such as argon (Ar), helium (He), krypton (Kr) and/or nitrogen ($N_2$). In one embodiment, the gas delivery system 250 is adapted to deliver a reactive gas and an inert gas. The pressure in the processing region 222 can be controlled by adjusting the flow rate of gas delivered by the gas delivery system 250 and the pumping speed of the vacuum pump 210. A throttle valve 211 may be used to adjust the pumping speed of the vacuum pump 210. The processing pressure may be between about 1 mTorr and about 500 mTorr, such as a pressure of about 20 mTorr.

The substrate support assembly 294 generally includes a substrate support 262 that contains a substrate supporting member 262A. The substrate supporting member 262A may be a conventional electrostatic chuck that can be used to actively hold the substrate during processing, or comprise a simple substrate support. A temperature controller 261 is generally adapted heat and/or cool the substrate supporting member 262A to a desired temperature by use of temperature controller 261 and a heat exchanging device, such as embedded resistive heating elements or fluid cooling channels that are coupled to a conventional heat exchanger (not shown). In one embodiment, the temperature controller 261 is adapted to operate and heat the substrate 202 positioned on the substrate supporting member 262A to a temperature between about 20° C. and about 800° C., such as about 400° C. The substrate 202 is not biased during processing because biasing may causing the surface 201 to be roughened.

Delivering RF energy from the RF generator 208 to the processing region 222 causes the gas atoms in the processing region 222 to become ionized. When the substrate 202 is exposed to plasma generated in or distributed to the processing region 222 during operation, the radicals and/or ions generated in the plasma will interact with the contamination disposed on the surface 201 of the substrate 202 causing it to desorb or be physically removed therefrom. In some configurations the plasma may knock off or cause the contaminants to desorb from the surface due to the energy transferred by the ionized atoms in the plasma striking the surface 201 of the substrate 202. As noted above, in some embodiments, it is desirable to minimize the amount of energy the plasma generated species have to reduce the chance of roughening the surface 201 during processing. In some embodiments, it is desirable to form a larger percentage of gas radicals versus energetic ionized species.

In one example of a process performed in step 102A, a hydrogen containing plasma may be generated with an RF power of between 10 W and 500 W at an RF frequency of 13.56 MHz, while the substrate 202 is maintained at a temperature of between about 15 and about 500° C. and the processing pressure in the processing region 222 is maintained at a pressure of 20 mTorr. In this example, the hydrogen ($H_2$) gas in inert gas concentration during processing may be between 2% and 100%.

In some embodiments of step 102A, the reducing process is at least partially preformed using a capacitively coupled plasma that is used to remove contaminants from the surface of the substrate. FIG. 3 schematically illustrates a cross sectional side view of a processing chamber 300 in accordance with another embodiment of the present invention. The processing chamber 300 is a capacitively coupled plasma generating chamber. The processing chamber 300 comprises a chamber lid assembly 330 sealably coupled to the process chamber assembly 396 and defining a process region 333. The processing region 333 can be evacuated to a desired vacuum pressure by the use of a vacuum pump 310 that is connected to the processing region 333 through the chamber base 327 and/or chamber walls 328. A throttle valve 311 may be used to adjust the pumping speed of the vacuum pump 210. Generally, the chamber walls 328 and chamber base 327 may be formed from a metal, such as aluminum, or other suitable material.

In this configuration, the chamber lid assembly 330 comprises a gas distribution plate (also known as a shower head) 332 and a base plate 331 having a blocker plate 334 substantially parallel to the gas distribution plate 332. The gas distribution plate 332 is isolated from the chamber walls 328 using an electric insulator 335. The chamber lid assembly 330 is connected to the gas delivery assembly 350. Reactant and/or cleaning gases from the gas delivery system 350 may be delivered to the process region 333 through a gas passage 336. The RF source assembly 391 is coupled to the base plate 331 to provide RF power for plasma generation to the processing region 333. An RF source for capacitive plasma generation generally comprises a radio frequency (RF) power source 308, for example, a 13.56 MHz RF generator, and an RF match circuit 308A. During processing, the substrate supporting member 362 may be grounded or may electrically float. The bias potential between the chamber walls 328 and the base plate 331 may be used to form a plasma in the process region 333. Activated species in the plasma can be used to process the substrate 302. Again a hydrogen containing plasma can be used, in this embodiment of the reducing process, to remove contaminants on the surface 301 of the substrate 302. In one example of a process performed in step 102A, a hydrogen containing plasma may be generated with an RF power of between 10 W and 500 W at an RF frequency of 13.56 MHz, while the substrate 302 is maintained at a temperature of between about 15 and about 500° C. and the processing pressure in the processing region 333 is maintained at a pressure of 500 mTorr. In this example, the hydrogen ($H_2$) gas in inert gas concentration during processing may be between 2% and 100%.

In another embodiment of step 102A, the reducing process is performed using an inductively coupled plasma to remove contaminants disposed on a surface of a substrate. In one embodiment, the inductively coupled plasma may contain $H_2$ or a gas mixture containing nitrogen gas ($N_2$) and $H_2$ or $NH_3$ gases. In some configurations, the inductively generated plasma is remotely generated. In one example, the processes performed in step 102A may include generating an inductively coupled plasma using an RF power of between 10 W and 500 W at an RF frequency of 13.56 MHz, while the substrate is maintained at a temperature of between about 15 and about 500° C. and the processing pressure in the processing region is maintained at a pressure of about 700 mTorr. In this example, the hydrogen ($H_2$) gas in inert gas concentration during processing may be between 2% and 100%. This reducing process may be performed in a processing chamber or in a support chamber. In configuration, the support chamber is a load lock chamber, or a similar chamber that is adapted to store or act as an interface between different regions of a cluster tool, which are discussed below. An exemplary load lock chamber for performing this reducing process is illustrated in FIG. 4.

FIG. 4 depicts one embodiment of the load lock chamber 400 utilized to perform a reducing process to remove contaminants from a surface of a substrate. The load lock chamber 400 generally comprises a chamber body 402, a first substrate holder 404, a second substrate holder 406, a temperature control pedestal 440 and a heater module 470. The chamber body 402 may be fabricated from a singular body of material such as aluminum. The chamber body 402 includes a first side wall 408, a second side wall 410, a top 414 and a bottom 416 that define a chamber volume 418. A window 450 typically comprised of quartz, is disposed in the top 414 of the chamber body 402 and is at least partially covered by the heater module 470.

The pressure of the chamber volume 418 may be controlled so that the load lock chamber 400 may be evacuated to substantially match the environment of a transfer chamber 436 and be vented to substantially match the environment of a factory interface 401. Additionally, the pressure of the chamber volume 418 may be controlled within a predetermined range that facilitates performing the contaminants removal process, as further described below. The chamber body 402 includes one or more vent passages 430 and a pump passage 432. The vent passage 430 and the pump passage 432 are positioned at opposite ends of the chamber body 402 to induce laminar flow within the chamber volume 418 during venting and evacuation to minimize particulate contamination. In one embodiment, two vent passages 430 are disposed through the top 414 of the chamber body 402, while the pump passage 432 is disposed through the bottom 416 of the chamber body 402. The passages 430, 432 typically are coupled to a valve 412 to selectively allow flow into and out of the chamber volume 418.

The vent passage 430 may be additionally coupled to a gas source 452 through a valve 440 to provide a gas mixture into the chamber volume 418. In one embodiment, the vent passage 430 may be configured as a gas distribution ring wherein the gas mixture may be distributed from adjacent the walls 410, 408 through an array of holes to optimize the flow uniformity. In another embodiment, the gas mixture may be supplied to the load lock chamber 400 through a gas distribution plate (not shown) disposed below the heater module 470. The gas distribution plate may be fabricated by a material transmissive to the heat generated from the heater module 470 such as not to substantially interfere with the heating of the substrates positioned on the substrate holders 404, 406. Examples of gases that may be supplied from the gas source 452 include $N_2$, Ar, $H_2$, helium (He), oxygen ($O_2$), ozone ($O_3$), wafer vapor ($H_2O$), and the like.

In one embodiment, a remote plasma source (RPS) 448 may be alternatively coupled to the vent passage 430 to assist in removing contaminants from the substrate surfaces. The remote plasma source 448 provides plasma formed from the gas mixture provided by the gas source 452 to the load lock chamber 400. In embodiment the RPS 448 is present, a diffuser (not shown) may be disposed at the outlet of the vent passage 430 to facilitate delivery the generated plasma into the load lock chamber 400.

A first loading port 438 is disposed in the first wall 408 of the chamber body 402 to allow a substrate 424 to be transferred between the load lock chamber 400 and the factory interface 401, which is discussed further below in conjunction with FIG. 6. A first slit valve 444 selectively seals the first loading port 438 to isolate the load lock chamber 400 from the factory interface 401. A second loading port 439 is disposed in the second wall 410 of the chamber body 402 to allow the substrate 424 to be transferred between the load lock chamber 400 and the transfer chamber 436, which is discussed further below in conjunction with FIG. 6. A second slit valve 446 which is substantially similar to the first slit valve 444 selectively seals the second loading port 439 to isolate the load lock chamber 400 from the vacuum environment of the transfer chamber 436.

The first substrate holder 404 is concentrically coupled to (i.e., stacked on top of) the second substrate holder 406 that is disposed above the chamber bottom 416. The substrate holders 404, 406 are generally mounted to a hoop 420 that is coupled to a shaft 482 that extends through the bottom 416 of the chamber body 402. Typically, each substrate holder 404, 406 is configured to retain one substrate. The shaft 482 is coupled to a lift mechanism 496 disposed exterior to the load lock chamber 400 that controls the elevation of the substrate holders 404 and 406 within the chamber body 402. A bellows 484 is coupled between the hoop 420 and the bottom 416 of the chamber body 402 and disposed around the shaft 482 to provide a flexible seal between the second substrate holder 406 and the bottom 416, thus preventing leakage from or into the chamber body 402 and facilitating raising and lowing of the substrate holders 404, 406 without compromising the pressure within the load lock chamber 400.

The first substrate holder 404 is utilized to hold an unprocessed substrate from the factory interface 401 while the second substrate holder 406 is utilized to hold a processed substrate returning from the transfer chamber 436. The flow within the load lock chamber 400 during venting and evacuation is substantially laminar due to the position of the vent passage 430 and pump passage 432 and is configured to minimize particulate contamination.

The processing/load lock chambers described above uses either inductively coupled plasma or capacitively coupled plasma to remove contaminants from a surface of a substrate. In another embodiment, a processing chamber may use microwave energy source to generate a reducing gas containing plasma (e.g., hydrogen containing plasma) that is used to perform the contaminants removal process of step 102A.

The reducing methods described above generally use a hydrogen containing plasma to remove contaminants from a substrate. Another approach to remove contaminants from the surface of a substrate is to use an oxidation process 102B. Oxidation processes may be suitable for use on silicon (Si) and germanium (Ge) surfaces, but may not be suitable for removing contaminants from a SiGe surface. Oxidation of a SiGe surface may result in compositional disturbance at the surface. In one embodiment, the oxidation process 102B utilizing an inductively coupled oxygen containing plasma at room temperature and 20 mTorr is performed to remove the contaminants. In another embodiment, a radical oxidation process is performed at a temperature of between about 50 and about 600° C., such as about 400° C. to remove the contaminants.

In another embodiment, the oxidation process 102B utilizes an inductively coupled oxygen containing plasma to remove the contaminants from the surface of the substrate. The radicals and/or ions generated in the oxygen containing plasma will interact with the contamination disposed on the surface of the substrate causing it to desorb or be physically removed therefrom. In some configurations the plasma may knock off or cause the contaminants to desorb from the surface due to the interaction of the energized oxygen containing gas atoms and the contaminants found on the surface of the substrate. The oxygen containing plasma may also form a thin oxide layer on the surface of the substrate which protects the surface from being roughened. The plasma may contain $O_2$ and $N_2$ and be remotely generated. The processing temperature may be about 250° C. and the processing pressure may be about 700 mT. In one example, an oxygen containing plasma may be generated using an RF power of between 100 W and 5000 W at an RF frequency of 13.56 MHz, while the substrate is maintained at a temperature of between about 15 and about 500° C. and the processing pressure in the processing region is maintained at a pressure of 700 mTorr. In this example, the oxygen containing gas in inert gas concentration may be between 2% and 100%. In one embodiment, this oxidation process 102B is performed in the load lock chamber 400, in which a remote plasma containing $O_2$ and $N_2$ is introduced through a quartz diffuser disposed at the outlet of the vent passage 430.

Referring back to FIG. 1, at step 102, the contaminants may be removed by one of the above mentioned reducing 102A and/or oxidation 102B contamination removal processes. Thus, the contaminants may be removed by an oxidation process 102B, a reducing process 102A, or a reducing process 102A followed by an oxidation process 102B. In some cases, the contaminants may be removed by performing an oxidation process 102B followed by a reducing process 102A. The oxidation/reducing processes 102B, 102A help removing contaminants such as carbon or hydrocarbons from a Si, Ge, or SiGe surface of a Si substrate prior to a cleaning process (step 104). In some cases, the contaminant free surface may comprise an oxide layer that is formed during step 102 or formed prior to step 102. The oxide layer may be a result of the oxidation process 102B described above, or a native oxide layer. At step 104, the surface of the substrate is further cleaned (e.g., removing the oxide layer) using a plasma etch process. The plasma etch process performed during at least a part of step 104 may be fluorine based.

In one embodiment, the plasma etch process is a remote plasma assisted dry etch process which involves the simultaneous exposure of a substrate to $NF_3$ and $NH_3$ plasma by-products. In one example, the plasma etch process may be similar to or may include a SiCoNi™ etch process that is available from Applied Materials, Inc. of Santa Clara, Calif. In some configurations that use remote plasma excitation of the gas species allows plasma-damage-free substrate processing. The remote plasma etch can be largely conformal and selective towards silicon oxide layers, and thus does not readily etch silicon regardless of whether the silicon is amorphous, crystalline or polycrystalline. The remote plasma process will generally produce solid by-products which grow on the surface of the substrate as substrate material is removed. The solid by-products can be subsequently removed via sublimation when the temperature of the substrate is raised. The plasma etch process results in a substrate surface having silicon-hydrogen (Si—H) bonds thereon.

In one embodiment, a plasma etch process may include an $NF_3$ flow rate within a range of about 1 sccm to about 20 sccm, such as about 5 sccm, as well as an $NH_3$ flow rate within a range of about 50 sccm to about 200 sccm, such as about 100 sccm. The plasma etch process may be performed at a pressure of about 5 Torr, and an RF power setting of about 30 W may be utilized to ionize the $NF_3$ and the $NH_3$. By-products may then be sublimated from the surface of the substrate by annealing the substrate at a temperature of about 120° C. or more for about 5 seconds to about 100 seconds, such as about 60 seconds. Other embodiments of fluorine based cleaning involve, reacting $NH_3$ gas and $F_2$ or anhydrous HF gas in either plasma or thermal heat to etch $SiO_2$ native oxides. Examples of gas flow ratios would be 1:1 to 1:10 gas flow ratio of fluorine gas to $NH_3$ gas at temperatures of 15° C. to 130° C.

FIG. 5 is a schematic cross sectional view of a cleaning chamber 500 that may be adapted to perform step 104. The chamber 500 may be particularly useful for performing a thermal or plasma-based oxidation process and/or a plasma assisted dry etch process. The chamber 500 includes a chamber body 512, a lid assembly 514, and a support assembly 516. The lid assembly 514 is disposed at an upper end of the chamber body 512, and the support assembly 516 is at least partially disposed within the chamber body 512. A vacuum system can be used to remove gases from chamber 500. The vacuum system includes a vacuum pump 518 coupled to a vacuum port 521 disposed in the chamber body 512.

The lid assembly 514 includes at least two stacked components configured to form a plasma volume or cavity there between. A first electrode 520 is disposed vertically above a second electrode 522 confining a plasma volume. The first electrode 520 is connected to a power source 524, such as a radio frequency (RF) power supply, and the second electrode 522 is connected to ground or a source return, forming a capacitance between the first electrode 520 and the second electrode 522. The lid assembly 514 also includes one or more gas inlets 526 for providing a cleaning gas to a substrate surface through blocker plate 528 and gas distribution plate 530. The cleaning gas may be an etchant or ionized active radical, such as ionized fluorine, chlorine, or ammonia, or an oxidizing agent, such as ozone. Additionally, the chamber 500 includes a controller 502 for controlling processes within the chamber 500.

The support assembly 516 may include a substrate support 532 to support a substrate 510 thereon during processing. The substrate support 532 may be coupled to an actuator 534 by a shaft 536 which extends through a centrally-located opening formed in a bottom surface of the chamber body 512. The actuator 534 may be flexibly sealed to the chamber body 512 by bellows (not shown) that prevent vacuum leakage from around the shaft 536. The actuator 534 allows the substrate support 532 to be moved vertically within the chamber body 512 between a process position and a lower, transfer position. The transfer position is slightly below the opening of a slit valve formed in a sidewall of the chamber body 512.

The substrate support 532 has a flat, or a substantially flat, surface for supporting a substrate to be processed thereon. The substrate support 532 may be moved vertically within the chamber body 512 by actuator 534 coupled thereto by shaft 536. In operation, the substrate support 532 may be elevated to a position in close proximity to the lid assembly 514 to control the temperature of the substrate 510 being processed. As such, the substrate 510 may be heated via radiation emitted or convection from the distribution plate 530.

A different cleaning process may be utilized to clean the substrate surface. In one embodiment, a remote plasma containing He and $NF_3$ is introduced into a processing chamber through a gas distribution plate, such as a showerhead. $NH_3$ is directly injected into the chamber via a separate gas inlet.

In one example of process sequence 100, the clean process (step 104) may be performed in the SiCoNi™ cleaning chamber, available from Applied Materials, Inc. of Santa Clara, Calif. Chambers available from other manufacturers may also be used to practice embodiments described herein. In one embodiment, both steps 102 and 104 may be performed in a single processing chamber, such as one of the chambers shown in FIGS. 2-5. In one example, the both steps 102 and 104 are performed in a SiCoNi™ cleaning chamber.

Next, at step 106, after the cleaning process is performed, an epitaxial silicon layer may be formed on the surface of the substrate. The surface of the substrate is contaminant free which improves the quality of the epitaxial layer subsequently formed on the surface of the substrate. In one example, the epitaxial deposition may be a selective epitaxial deposition process performed at a temperature that is less than 800° C. In this example, the temperature is set such that it will not exceed 800° C., in order to limit the wafer thermal budget for delicate features that may distort or diffuse if overheated. In one embodiment, the epitaxial layer is deposited using a high temperature chemical vapor deposition (CVD) process. In this thermal CVD process, processing gases such as dichlorosilane, silane, disilane, germane, hydrogen chloride, or combinations thereof are used to deposit the epitaxial layer. The processing temperature is under 800° C. and the processing pressure is between 5 and 600 Torr. When steps 102, 104 and 106 are performed, contaminants at interfaces have been reduced and the epitaxial layer formed is relatively defect free.

Figure 6:
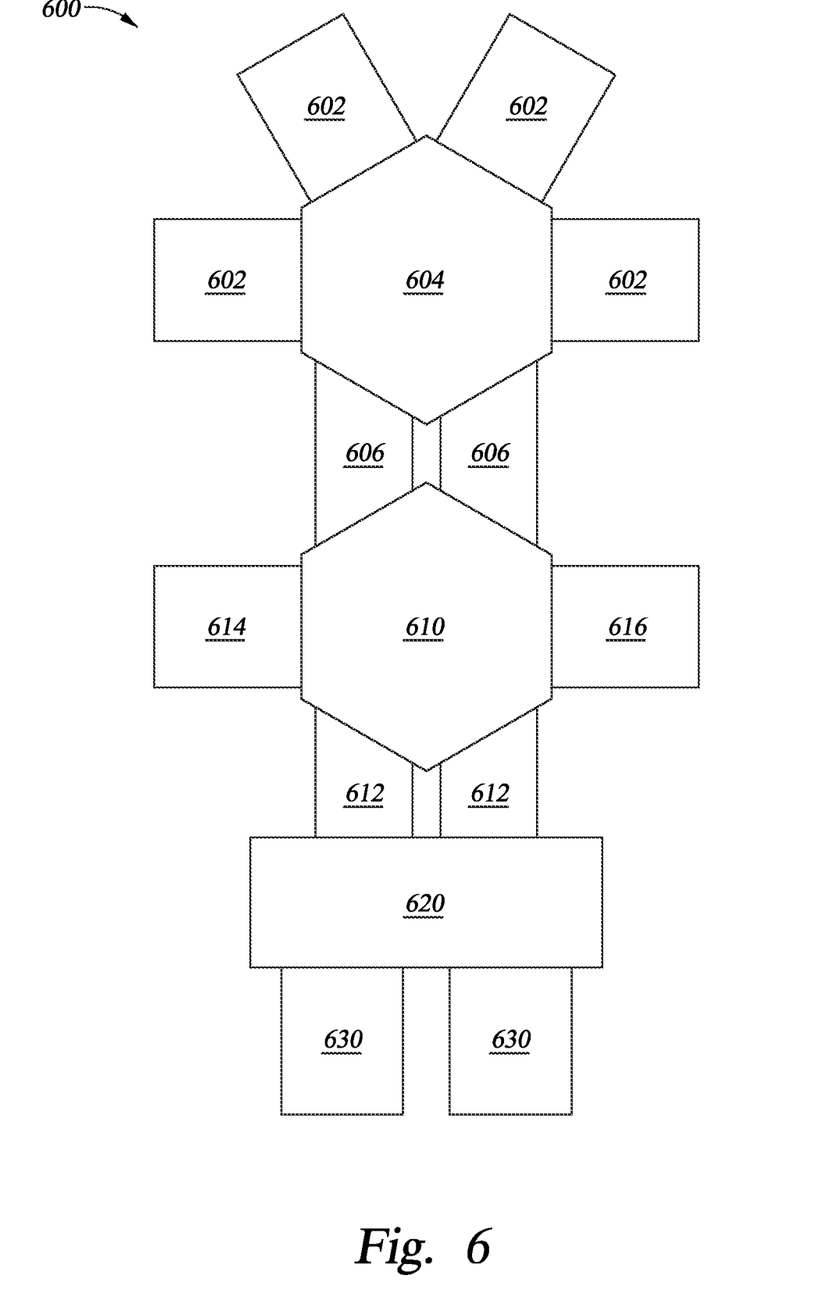
FIG. 6 illustrates a processing system that can be used to complete the processing sequence illustrated in FIG. 1 according to embodiments of the invention.
Figure 7:
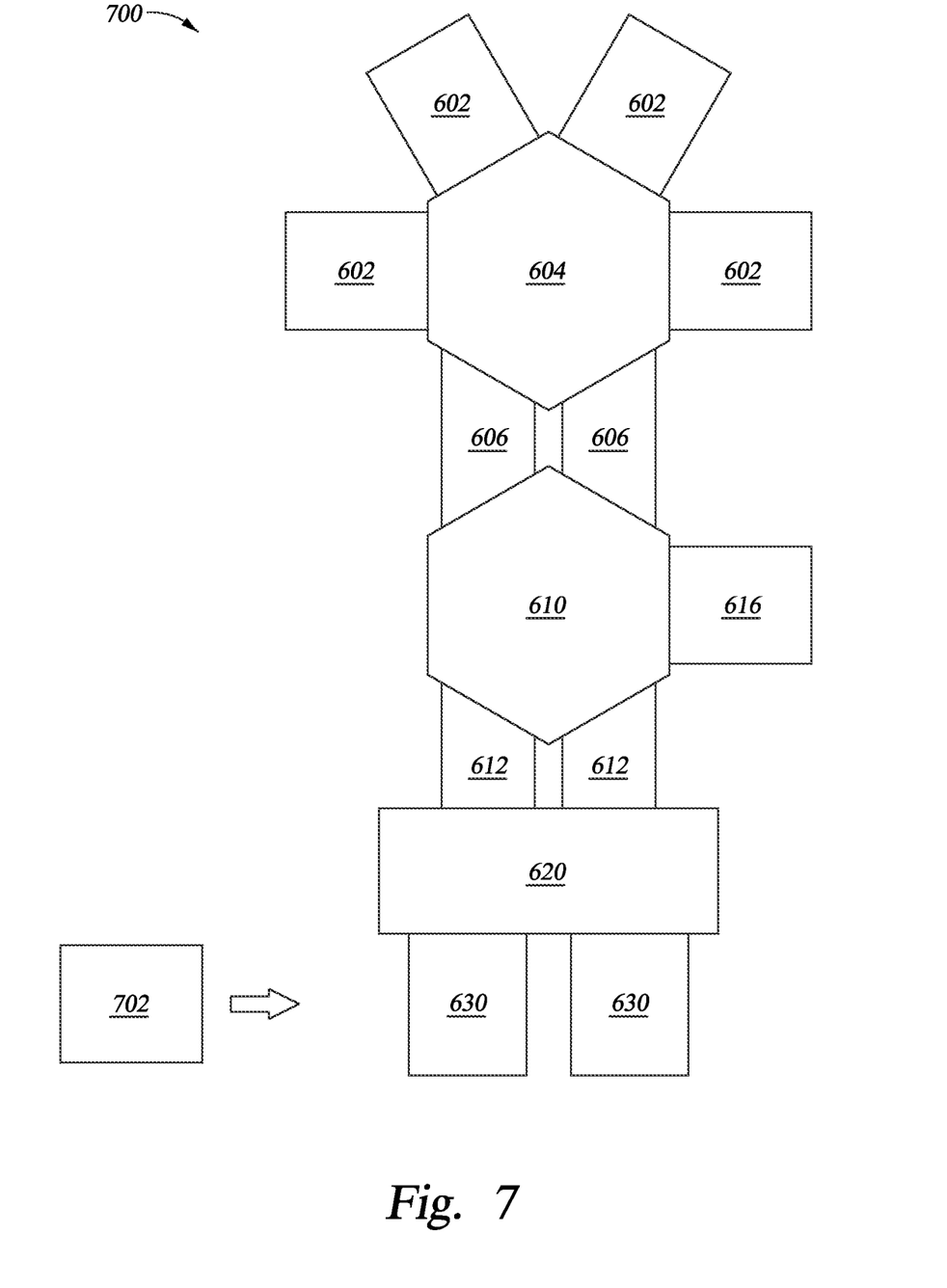
FIG. 7 illustrates another processing system that can be used to complete the processing sequence illustrated in FIG. 1 according to embodiments of the invention.

FIG. 6 illustrates a processing system 600 that can be used to complete the processing sequence 100 illustrated in FIG. 1, according to embodiments of the invention. As shown in FIG. 6, a plurality of processing chambers 602 is coupled to a first transfer chamber 604. The first transfer chamber 604 is also coupled to a first pair of processing chambers 606. The first transfer chamber 604 has a centrally disposed transfer robot (not shown) for transferring substrates between the processing chambers 606 and the processing chambers 602. The processing chambers 606 are coupled to a second transfer chamber 610, which is coupled to a processing chamber 614 for removing contaminants (step 102) and a cleaning chamber 616 for cleaning the substrate (step 104). The second transfer chamber 610 has a centrally disposed transfer robot (not shown) for transferring substrates between a set of load lock chamber 612 and the processing chamber 614 or the cleaning chamber 616. A factory interface 620 is connected to the second transfer chamber 610 by the load lock chambers 612. The factory interface 620 is coupled to one or more pods 630 on the opposite side of the load lock chambers 612. The pods 630 typically are front opening unified pods (FOUP) that are accessible from the clean room.

During operation, a substrate is first transferred to the processing chamber 614 in a reducing process, an oxidation process, or a reducing process followed by an oxidation process, or vice versa, is performed to remove contaminants such as carbon or hydrocarbons from the substrate surface. The contaminants removal process is described in FIG. 1 under step 102. Then the substrate is transferred to the cleaning chamber 616 in which step 104 is performed. The queue time between step 102 and step 104 may be 8 to 12 hours. In one embodiment, the queue time between step 102 and step 104 is about 2 to 3 hours. Queue time is generally defined as the time a substrate can be exposed to the atmospheric or other contaminants after a first process has been completed on the substrate before a second process must be completed on the substrate to prevent some adverse affect on the fabricated device's performance.

The clean substrate is then transferred to one or more processing chambers 602 in which the epitaxial deposition, as described under step 106 is performed. Because all three steps 102, 104 and 106 are performed within the same processing system, vacuum is not broken as the substrate is transferred to various chambers, which decreases the chance of contamination and improves the quality of the deposited epitaxial film.

In another embodiment, the contaminants removal step 102 is performed in a chamber that is not a part of the processing system that contains the cleaning chamber 616 and the one or more processing chambers 602. As shown in FIG. 7, contaminants on the substrate surface are removed in a processing chamber 702. The substrate is then transferred to the processing system 700, which is the processing system 600 without the processing chamber 614. The substrate is transferred to the cleaning chamber 616 in which step 104 is performed. Then the substrate is transferred to at least one of the processing chambers 602 in which step 106 is performed.

In summary, methods of removing contaminants from a substrate surface and cleaning the substrate prior to epitaxial deposition are disclosed. The contaminants removal process may be a reducing process, an oxidizing process, or a processing sequence that includes a reducing process and an oxidizing process. Then a fluorine containing plasma etch is performed on the substrate to remove an oxide layer. Since the fluorine containing plasma etch may be ineffective in removing the contaminants which can be hydrocarbon or carbon based, the removal process prior to the plasma etch helps removing the contaminants, which in turn improves the quality of the epitaxial layer subsequently deposited on the substrate.

While the foregoing is directed to embodiments of the present invention, other and further embodiments of the invention may be devised without departing from the basic scope thereof, and the scope thereof is determined by the claims that follow.

The invention claimed is:

1. A method for forming an epitaxial layer on a surface of a substrate, comprising:
    removing a first portion of carbon containing contaminants from the surface of the substrate, wherein the first portion of the carbon containing contaminants are removed by a hydrogen containing plasma process; then
    removing a second portion of the carbon containing contaminants by an oxidizing process, wherein the hydrogen containing plasma process and the oxidizing process are performed in a first processing chamber; then
    cleaning the surface of the substrate by use of a fluorine containing plasma etch process in a second processing chamber; and then
    forming an epitaxial layer on the surface of the substrate.

2. The method of claim 1, wherein the hydrogen containing plasma process utilizes an inductively coupled plasma.

3. The method of claim 1, wherein the hydrogen containing plasma process is performed at a pressure of about 20 mT.

4. The method of claim 1, wherein the hydrogen containing plasma process utilizes a capacitively coupled plasma with hydrogen containing gas.

5. The method of claim 1, wherein the hydrogen containing plasma process utilizes a plasma that is energized by a microwave with hydrogen containing gas.

6. The method of claim 1, further comprising heating the surface of the substrate following the plasma etch process.

7. The method of claim 1, wherein the fluorine containing plasma etch process comprises flowing $NF_3$ gas into a remote plasma source.

* * * * *